United States Patent [19]
Tsutsumi et al.

[11] Patent Number: 5,183,722
[45] Date of Patent: Feb. 2, 1993

[54] POSITIVE PHOTOSENSITIVE COMPOSITION FOR FORMING LENSES CONTAINING 1,2-NAPHTHOQUINONE DIAZIDE SULFONATE PHOTOSENSITIZER, ALKALI-SOLUBLE RESIN AND THERMOSETTING AGENT AND PROCESS FOR PRODUCING THE COMPOSITION

[75] Inventors: Yoshitaka Tsutsumi, Kudamatsu; Teruhisa Uemura; Masazumi Hasegawa, both of Shinnanyo, all of Japan

[73] Assignee: Tosoh Corporation, Shinnanyo, Japan

[21] Appl. No.: 620,002

[22] Filed: Nov. 30, 1990

[30] Foreign Application Priority Data

Dec. 1, 1989 [JP] Japan .................................. 1-310512

[51] Int. Cl.$^5$ ........................... G03F 7/023; G03C 1/61
[52] U.S. Cl. ..................................... 430/169; 430/165; 430/191; 430/192; 430/193
[58] Field of Search ............... 430/191, 169, 192, 193, 430/165

[56] References Cited

U.S. PATENT DOCUMENTS

| | | | |
|---|---|---|---|
| 4,581,321 | 4/1986 | Stahlhofen | 430/191 |
| 4,873,176 | 10/1989 | Fisher | 430/191 |
| 5,128,232 | 7/1992 | Thackeray et al. | 430/192 |

FOREIGN PATENT DOCUMENTS 0164248 12/1985 European Pat. Off. .
0401499 12/1990 European Pat. Off. .

*Primary Examiner*—Charles L. Bowers, Jr.
*Assistant Examiner*—Christopher G. Young
*Attorney, Agent, or Firm*—Oblon, Spivak, McClelland, Maier & Neustadt

[57] ABSTRACT

A positive photosensitive composition for forming lenses, which comprises a polymer, a photosensitive agent, a thermosetting agent and a solvent, wherein said polymer is an alkali-soluble resin, said photosensitive agent is a 1,2-naphthoquinone diazide sulfonate, and said thermosetting agent is a thermosetting agent capable of imparting heat resistance and solvent resistance at the time of forming lenses by heat treatment.

8 Claims, 2 Drawing Sheets

POSITIVE PHOTOSENSITIVE COMPOSITION FOR FORMING LENSES CONTAINING 1,2-NAPHTHOQUINONE DIAZIDE SULFONATE PHOTOSENSITIZER, ALKALI-SOLUBLE RESIN AND THERMOSETTING AGENT AND PROCESS FOR PRODUCING THE COMPOSITION

The present invention relates to a positive photosensitive composition useful as a material for forming micro focusing lenses on a color filter for e.g. a color charge coupled device or a color liquid crystal display.

In recent years, there has been an increasing demand for charge coupled devices having a high image quality along with wide use of color video cameras in which charge coupled devices are employed. Such charge coupled devices are classified into CCD type and MOS type as basic types. To produce such devices, it is necessary to provide a color filter on a CCD or MOS chip. The following two methods are available to provide such a filter: namely, (1) a method of laminating on a CCD or MOS chip a color filter formed on a glass plate (laminating method), and (2) a method wherein color filter is directly formed by a dying method on the CCD or MOS chip (on-chip method).

In the lamination method, the precision for lamination of the color filter and the CCD or MOS chip is required to be not more than 2 $\mu$m, and it is difficult to attain the requirement for high image quality. Further, if bubbles remain in the lamination plane, there will be various problems, and it has a problem that the yield can not be improved adequately. Therefore, this method is now being replaced by the on-chip method.

In the on-chip method, for example, as shown in FIG. 1, color filter layers and interlayers are alternately laminated in two or three layers on the surface of a device having a photodiode formed on a silicon substrate. As the color filter for this purpose, a photosensitive material having a dichromate incorporated to gelatin, casein, polyvinyl alcohol or glue, is employed. Such a photosensitive material is, after curing and patterning, dyed with a dyestuff having prescribed spectral characteristics. As the interlayers, a heat or light curable polyglycidyl methacrylate (PGMA) type or a modified PGMA type is employed. Further, a surface protecting layer is provided on the color filter layers and interlayers to make the surface flat. And micro focusing lenses are provided as the top layer. As disclosed in e.g. Japanese Unexamined Patent Publications No. 91103/1989, No. 246505/1989, No. 257901/1989 and No. 263601/1989, these lenses are effective for improving the sensitivity of the device and reducing the returning strain of output signals of the device, and thus formation of such lenses has become an essential condition for a color charge coupled device.

Various methods are useful for forming micro focusing lenses. For example, as disclosed in Japanese Unexamined Patent Publication No. 246505/1989, they may be formed by coating a transparent photosensitive resin on a surface-protecting layer, then exposing and developing it so that a resin layer remains at the areas corresponding to the photodiode, followed by thermal treatment of the pattern (see FIG. 2).

With respect to the lens-forming material, there is no commercially available product, and a material for another purpose is usually employed. The properties required for the lens material include an excellent lens-forming ability and a resist function of high sensitivity with a high resolution in addition to a high refractive index, high transparency in a visible light range and excellent heat resistance, solvent resistance and light resistance after patterning.

For example, when a positive photoresist for semiconductor integrated circuits is used as a lens material, micro focusing lenses can be formed by coating, prebaking, exposure, development and heat treatment. Among the above mentioned properties, it is possible to attain satisfactory results with respect to the refractive index, the lens-forming ability, the high sensitivity and the high resolution, but the heat resistance, solvent resistance and light resistance after the patterning tend to be inadequate. Particularly, with respect to the heat resistance, there are serious problems such that when heated again after the formation of lenses, the lens pattern flows again, and the transparency deteriorates substantially. Therefore, such material can not be used as a lens material.

None of other materials have been found to satisfy all the required properties. Under the circumstances, it is desired that a satisfactory material is developed as soon as possible.

It is an object of the present invention to provide a composition useful for the material which fulfills the above mentioned required properties.

Another object of this invention is to provide a process for producing the composition. A further object of this invention is to provide the use of the composition for forming micro lenses provided on a charge coupled device.

The present inventors have found that when an alkali-soluble polymer having an aromatic ring component and a carboxylic acid component, or a hydrogenation product and/or a resin having hydroxyl groups partially modified, of a vinylphenol polymer or a novolak resin which is a condensation product of a phenol with an aldehyde, is used as the base polymer, the transparency will not deteriorate when the lenses are heated again after being molded, and that the above object can be accomplished with a positive photosensitive composition comprising such as base polymer, a naphthoquinone diazide photosensitive agent, and a thermosetting agent capable of imparting heat resistance and solvent resistance to the lenses thereby formed. The present invention has been accomplished on the basis of such discoveries.

Thus, the present invention provides a positive photosensitive composition for forming lenses, which comprises a polymer, a photosensitive agent, a thermosetting agent and a solvent, wherein said polymer is an alkali-soluble resin, said photosensitive agent is a 1,2-naphthoquinone diazide sulfonate, and said thermosetting agent is a thermosetting agent capable of imparting heat resistance and solvent resistance at the time of forming lenses by heat treatment.

More specifically, the present invention provides a positive photosensitive composition which comprises as said polymer, a resin comprising structural units of the following formula (1) or (2), or a hydrogenation product and/or a resin having hydroxyl groups partially modified, of a vinylphenol polymer or a novolak resin which is a polycondensation product of a phenol with an aldehyde, a 1,2-naphthoquinone diazide sulfonate of the formula (3), (4) or (5) and a thermosetting agent capable of imparting heat resistance and solvent resistance to the lenses thereby formed.

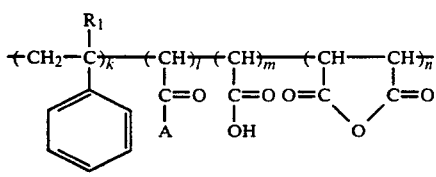

(1)

wherein $R_1$ is hydrogen or a methyl group, A is $OA_1$ or $NA_2A_3$ wherein each of $A_1$, $A_2$ and $A_3$ is hydrogen, a $C_1$-$C_6$ alkyl group, a $C_6$-$C_{12}$ aryl group or a $C_7$-$C_{12}$ aralkyl group, each of k and m is an integer of at least 1, and each of l and n is an integer inclusive of 0.

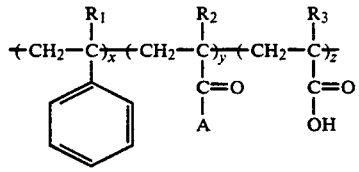

(2)

wherein $R_1$ is hydrogen or a methyl group, each of $R_2$ and $R_3$ is hydrogen, a methyl group, chlorine or bromine, A is $OA_1$ or $NA_2A_3$ wherein each of $A_1$, $A_2$ and $A_3$ is hydrogen, a $C_1$-$C_6$ alkyl group, a $C_6$-$C_{12}$ aryl group or a $C_7$-$C_{12}$ aralkyl group, each of x and y is an integer inclusive of 0, and z is an integer of at least 1.

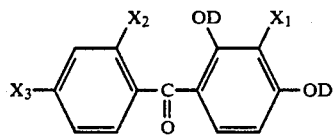

(3)

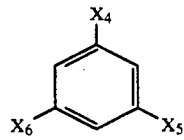

(4)

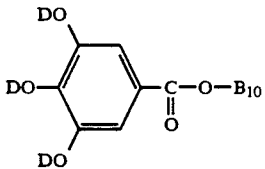

(5)

wherein each of $X_1$, $X_2$ and $X_3$ is hydrogen or OD, each of $X_4$, $X_5$ and $X_6$ is hydrogen, a $C_1$-$C_6$ alkyl group or OD, B is a $C_1$-$C_6$ alkyl group, a $C_6$-$C_{12}$ aryl group, or $C_7$-$C_{12}$ aralkyl group, and D is hydrogen, a 1,2-naphthoquinone diazide-4-sulfonyl group or a 1,2-naphthoquinone diazide-5-sulfonyl group, provided at least one is a 1,2-naphthoquinone diazide-4-sulfonyl group or a 1,2-naphthoquinone diazide-5-sulfonyl group.

Figure 1:
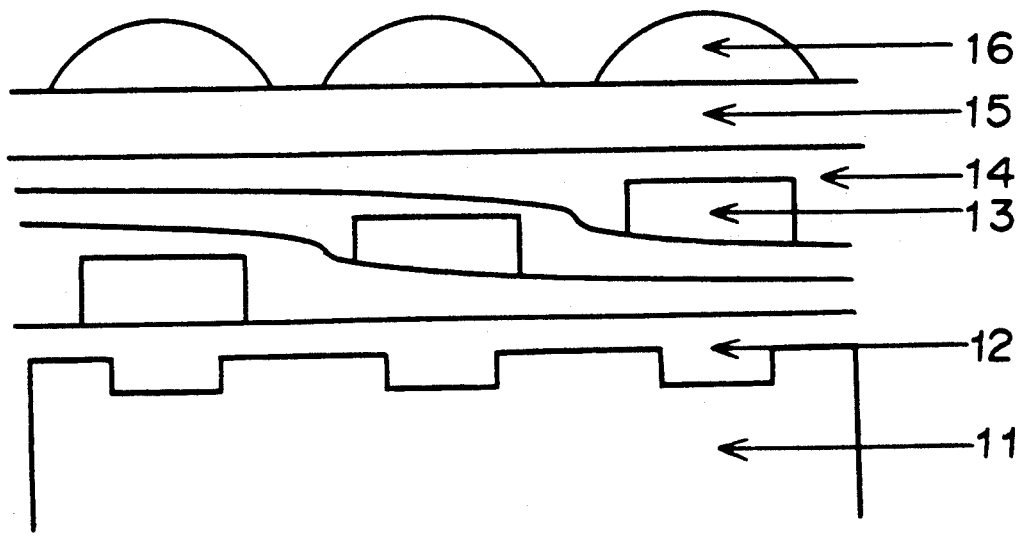
FIG. 1 is a cross sectional view of a color filter.
Figure 2:
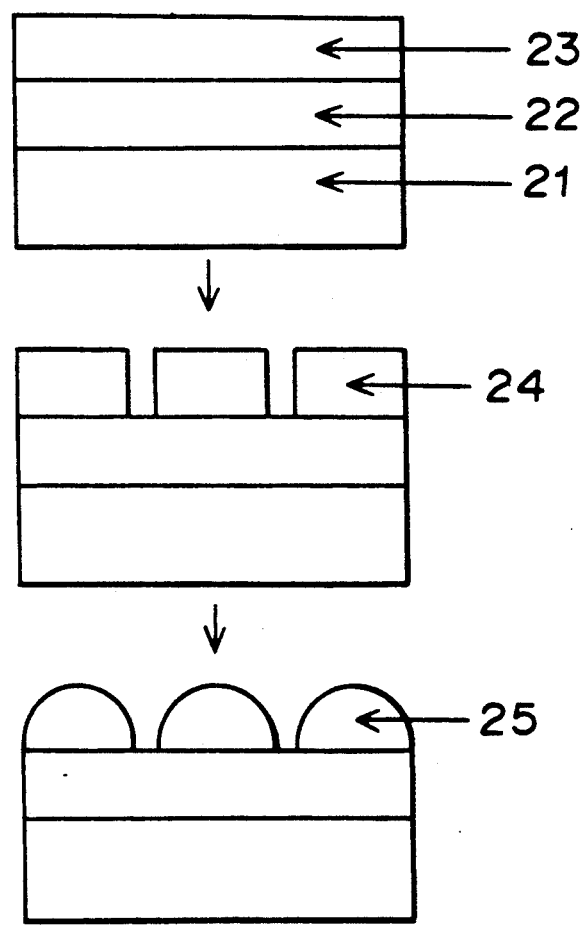
FIG. 2 is a view illustrating a method for forming micro focussing lenses.

In these Figures, reference numeral 11 designates a silicon wafer, numeral 12 indicates a flattened layer, numeral 13 indicates a color filter, numeral 14 indicates a protecting interlayer, numeral 15 indicates a surface protecting layer, numeral 16 indicates a lens, numeral 21 indicates a color filter layer, numeral 22 indicates a surface protecting layer, numeral 24 indicates a patterning of lens-forming material, and numeral 25 indicates heat treatment after patterning.

Further, as the thermosetting agent having the above mentioned properties, a melamine compound of the formula (6) is effective.

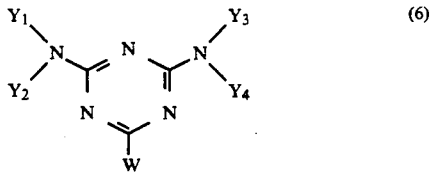

(6)

wherein W is $-NY_5Y_6$ or a phenyl group, each of $Y_1$ to $Y_6$ is hydrogen or $-CH_2OZ$ wherein Z is hydrogen or a $C_1$-$C_6$ alkyl group.

In the above formulas, the alkyl group for $A_1$-$A_3$, B, $X_4$-$X_6$ and Z includes a methyl group, an ethyl group, a n-propyl group, an isopropyl group, a n-butyl group, an isobutyl group, a t-butyl group, a n-amyl group, an isoamyl group, a n-hexyl group or a cyclohexyl group, and the aryl group for $A_1$-$A_3$ and B includes a phenyl group, a tolyl group, a xylyl group, an ethylphenyl group and a naphthyl group, wherein the benzene ring may be substituted by a halogen such as chlorine or bromine, a nitro group, or a cyano group. The aralkyl group includes a benzyl group and phenethyl group, wherein the benzene ring may be substituted by a halogen such as chlorine or bromine, a nitro group, or a cyano group.

In the present invention, preparation of alkali-soluble polymers is not particularly limited. For example, they may be prepared by the following methods.

With respect to (1), a (α-methyl)styrene/maleic anhydride copolymer is prepared by solution or bulk radical polymerization in accordance with a usual method, followed by esterification with an alcohol or an amide-forming reaction with an amine to obtain the desired resin. Otherwise, it may be prepared by subjecting a styrene/maleate copolymer to solution or bulk radical polymerization in accordance with a usual method.

With respect to (2), a (α-methyl)styrene/(meth)acrylic acid or (α-methyl)styrene/(meth)acrylate copolymer is prepared by solution radical polymerization or the like in accordance with a usual method, followed by esterification or an amide forming reaction, or by hydrolysis to obtain the desired resin. Otherwise, it may be prepared by a method wherein esterified or amide-modified monomers are subjected to multi-component copolymerization, or by a method wherein a poly(meth-)acrylic acid is subjected to esterification or amide-forming reaction.

There is no particular restriction as to the method for hydrogenating a vinylphenol polymer or a novolak resin. However, the hydrogenation product can be prepared by the methods disclosed in e.g. Japanese Unexamined Patent Publications No. 103604/1989, No. 254/1990, No. 29751/1990 and 29752/1990. The modification of hydroxyl groups of the vinylphenol polymer or the novolak resin may be conducted by a reaction such as alkylation, acylation or sulfonylation. For example, the alkylation can be conducted by reacting a resin and an alkyl halide in the presence of a basic catalyst, and the acylation and sulfonylation can be conducted by reacting a resin with a carboxylic acid or sulfonic acid, or with a carbonyl halide or sulfonyl halide, in the presence of an acid catalyst or a basic catalyst.

The photosensitive agent to be used in the present invention is a 1,2-naphthoquinone diazide sulfonate of the formula (3), (4) or (5), wherein the ester moiety includes, for example, 2,4-dihydroxybenzophenone, 2,3,4-trihydroxybenzophenone, 2,3,4,4'-tetrahydroxybenzophenone, 2,2'3,4,4'-pentahydroxybenzophenone, phenol, 1,3-dihydroxybenzene. 1,3,5-trihydroxybenzene, methyl gallate, ethyl gallate and phenyl gallate.

The thermosetting agent to be used in the present invention is not particularly limited, so long as it does not deteriorate the properties. The one having particularly excellent properties is a melamine compound of the formula (6). Specifically, it includes, hexamethylolmelamine, an alkylated hexamethylolmelamine, a partially methylol-modified melamine and an alkylated product thereof, tetramethylolbenzoguanamine, an alkylated tetramethylolbenzoguanamine, a partially methylol-modified benzoguanamine and an alkylated product thereof.

The positive photosensitive composition of the present invention comprises the above mentioned alkali-soluble resin, the photosensitive agent and the thermosetting agent, and the present invention has features in the respective materials and the combination thereof. Namely, an alkali-soluble system having a high refractive index and excellent transparency can be realized by using as the base resin a polymer having a polystyrene backbone and carboxylic acid simultaneously, or a hydrogenation product and/or a resin having hydroxyl groups partially modified, of a vinylphenol polymer or a novolak resin. Besides, the transparency is free from change with time, as an additional feature. A polymer having a polystyrene backbone(s) and a carboxylic acid group(s) is especially excellent in transparency. By using a 1,2-naphthoquinone diazide sulfonate as the photosensitive agent and by mixing it with the above mentioned alkali-soluble resin, it is possible to realize a resist having a high resolution which does not swell in an alkaline developing solution. Further, a thermosetting agent is necessary to impart the heat resistance and the solvent resistance. Further, it is thereby possible to conduct heat curing at the same time as the formation of the lenses. This is very advantageous from the viewpoint of the process. In the positive photosensitive composition of the present invention, the proportions of the alkali-soluble resin, the photosensitive agent and the thermosetting agent may be varied within a range where the desired properties can be maintained. However, the following range is, for example, preferred. Namely, the photosensitive agent is preferably from 10 to 30% by weight relative to the resin, and the thermosetting agent is preferably from 5 to 30% by weight relative to the solid content. Within such ranges, constant satisfactory properties can be guaranteed with respect to the adhesion, the transparency, the sensitivity, the resolution and the lens-forming ability.

The positive photosensitive composition of the present invention can be obtained by dissolving the resin, the photosensitive agent and the thermosetting agent in a suitable solvent so that the solid content will be from 10 to 40% by weight based on the composition. The solvent may be, for example, an ethylene glycol monoalkylether or its acetate, a propylene glycol monoalkylether or its acetate, diethylene glycol mono- or dialkyl ether, a ketone such as methyl ethyl ketone, methyl isobutyl ketone or cyclohexanone, an acetic acid ester such as ethyl acetate or butyl acetate, an aromatic hydrocarbon such as toluene or xylene, ethyl lactate, diacetone alcohol, dimethylacetamide, dimethylformamide or N-methylpyrrolidone. These solvents may be used alone or in combination as a mixture of two or more. Further, as the case requires, it is possible to add a surfactant of nonionic type, fluorine type or silicon type in order to improve the coating properties. Further, if necessary, other compatible additives may be incorporated.

The positive photosensitive composition of the present invention is useful for forming a resist pattern by e.g. ultraviolet rays, deep ultraviolet rays, electron beams or X-rays, and it is excellent in the sensitivity and the resolution. Particularly, it is possible to form focusing lenses by conducting baking treatment after formation of the pattern. The formed lenses have a high refractive index and are excellent in transparency, heat resistance and solvent resistance.

There is no particular restriction as to the method to be used for forming a resist pattern by irradiation with radiation using the positive photosensitive composition of the present invention, and formation of the resist pattern can be conducted by a commonly employed method. Further, the lens pattern can be obtained by conducting baking treatment after forming the resist pattern.

For example, firstly, a photosensitive resin solution is prepared by dissolving the alkali-soluble resin of the present invention, the photosensitive agent and the thermosetting agent in a solvent and removing insoluble components by filtration (e.g. by means of a filter with an opening diameter of about 0.2 μm). The photosensitive resin solution is spin-coated on a substrate such as a silicon wafer or on a resin hard-baked on a solicon wafer, followed by prebaking to obtain a photosensitive resin layer. Then, exposure is conducted by means of e.g. a stepper, a proximity alinger, a mirror projection or an electron beam exposure apparatus, followed by development and rinsing to form a resist pattern. As the developing solution, an aqueous solution of an inorganic alkali such as sodium hydroxide, potassium hydroxide, sodium carbonate, sodium silicate, sodium methasilicate or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanol amine or triethanol amine, tetramethyl ammonium hydroxide, tetraethyl ammonium hydroxide, or choline, can be used. Further, an alcohol or a surfactant may be incorporated in a suitable amount to the above aqueous alkaline solution. The coating, the baking, the exposure, the development, the rinsing and other processings can be conducted by methods commonly employed for forming resist patterns for the production of integrated circuits, etc. In the above described manner, a resist pattern can be formed. Then, a lens pattern can be formed by firstly subjecting the formed resist pattern to entire surface exposure with ultraviolet rays to impart transparency, followed by heat treatment on a hot plate or in a convection oven at a prescribed temperature within a range of from 100° C. to 160° C., preferably from 130° C. to 160° C., for a predetermined period of time within a range of from 1 to 30 minutes. The shape and the curvature of the lenses can optionally be selected by adjusting upon the presetting conditions.

Now, the present invention will be described in further detail with reference to Examples. However, it should be understood that the present invention is by no means restricted to such specific Examples.

PREPARATION EXAMPLE 1

Into a 1 l four necked flask, 39.0 g of styrene, 10.7 g of methacrylic acid, 4.0 g of α,α'-azobisisobutyronitrile (AIBN) and 500 g of dioxane were charged, and deaeration and substitution with nitrogen were conducted by a usual method. Then, the temperature was raised to 70° C., and the mixture was stirred for 5 hour. The reaction solution was poured into 5 l of n-hexane under stirring, and the polymer was permitted to precipitate. The precipitate was dried under vacuum to obtain 40.0 g of a white powdery polymer. The weight average molecular weight measured by GPC (gel permeation chromatography) was 5,500 as calculated as polystyrene.

PREPARATION EXAMPLE 2

Into a 1 l four necked flask, 31.0 g of styrene, 18.0 g of methacrylic acid, 4.0 g of α,α'-azobisisobutyronitrile (AIBN) and 500 g of dioxane were charged, and polymerization was conducted in the same manner as in Preparation Example 1 to obtain 41.5 g of a white powdery polymer. The weight average molecular weight measured by GPC was 6,800 as calculated as polystyrene.

Then, into a 500 ml four necked flask, 30.0 g of the above polymer and 50 ml of methanol were added and dissolved, and then 4.2 of potassim hydroxide was added, stirred and dissolved. Then, 16.2 g of benzyl bromide and 100 ml of dimethyl sulfoxide were added thereto, and the mixture was stirred at 80° C. for 2 hours. The reaction solution was dropwise added to a methanol/1.5% hydrochloric acid aqueous solution (volume ratio of 1/1). A white powder was recovered and vacuum-dried to obtain a partial benzyl ester of a styrene/methacrylic acid copolymer (esterification rate: 50% to methacrylic acid, as determined by potentiometric titration). The obtained amount was 32.5 g.

PREPARATION EXAMPLE 3

Into a 1 l four necked flask, 50.0 g of methacrylic acid, 10.0 g of α,α'-azobisisobutyronitrile (AIBN), 5.0 g of n-dodecylmercaptan and 500 g of methyl ethyl ketone were charged and stirred at 70° C. for 6 hours. The precipitated polymer powder was washed with methyl ethyl ketone and vacuum-dried to obtain a polymethacrylic acid powder. The obtained amount was 42.0 g.

Then, into a 500 ml four-necked flask, 20.0 g of the polymethacrylic acid and 50 ml of methanol were added and dissolved, and then 12.3 of potassim hydroxide was added, stirred and dissolved. Then, 47.7 g of benzyl bromide and 100 ml of dimethyl sulfoxide were added thereto, and the mixture was stirred at 80° C. for 2 hours. The reaction solution was dropwise added to a methanol/1.5% hydrochloric acid aqueous solution (volume ratio of 1/1). A white powder was recovered and vacuum-dried to obtain a partial benzyl ester of a polymethacrylic acid (esterification rate: 80% as determined by potentiometric titration). The obtained amount was 35.0 g. Further, the weight average molecular weight measured by GPC was 6,000 as calculated as polystyrene.

PREPARATION EXAMPLE 4

Into a 1 l four necked flask, 180 g of styrene, 86.5 g of maleic anhydride, 2.0 g of benzoyl peroxide and 600 ml of acetone were charged, stirred and dissolved. Then, under a nitrogen stream, stirring was continued at 50° C. for 8 hours. The reaction solution was put into n-hexane to let the resin precipitate. Purification with an acetone/n-hexane system was repeated, followed by vacuum drying at 40° C. to obtain a resin powder. The obtained amount was 252 g. The weight average molecular weight measured by GPC was 4,800 as calculated as polystyrene. Further, the copolymerization ratio calculated from the elemental analytical values was styrene/maleic anhydride =2/1.

PREPARATION EXAMPLE 5

Into a 1 l four necked flask, 135 g of styrene, 130 g of maleic anhydride, 2.0 g of benzoyl peroxide and 600 ml of acetone were charged, stirred and dissolved. Then, under a nitrogen stream, stirring was continued at 50° C. for 8 hours. The reaction solution was put into n-hexane to let the resin precipitate. Purification with an acetone/n-hexane system was repeated, followed by vacuum drying at 40° C. to obtain a resin powder. The obtained amount was 255 g. The weight average molecular weight measured by GPC was 4,500 as calculated as polystyrene. Further, the copolymerization ratio calculated from the elemental analytical values was styrene/maleic anhydride =1/1.

PREPARATION EXAMPLE 6

Into a 1 l four necked flask, 100 g of the styrene/maleic anhydride copolymer obtained in Preparation Example 4 and 700 g of benzyl alcohol were charged and reacted at 130° C. for 30 hours. The reaction solution was dropwise added to a n-hexane/isopropyl alcohol mixed solution to let the polymer precipitate. Then, the precipitate was dissolved in tetrahydrofuran, and the polymer was again precipitated in a n-hexane/isopropyl alcohol mixed solution. Then, it was vacuum-dried to obtain a powder of a benzyl ester of a styrene/maleic anhydride copolymer (esterification rate: 105% to maleic anhydride, as determined by potentiometric titration). The obtained amount was 85 g. Further, the weight average molecular weight measured by GPC was 7,000 as calculated as polystyrene.

PREPARATION EXAMPLE 7

Into a 1 l four necked flask, 100 g of the styrene/maleic anhydride copolymer obtained in Preparation Example 5 and 700 g of benzyl alcohol were charged and reacted at 130° C. for 40 hours. The reaction solution was dropwise added to a n-hexane/isopropyl alcohol mixed solution to let the polymer precipitate. Then, the precipitate was dissolved in tetrahydrofuran, and the polymer was again precipitated in a n-hexane/isopropyl alcohol mixed solution. Then, it was vacuum-dried to obtain a powder of a benzyl ester of a styrene/maleic anhydride copolymer (esterification rate: 135% to maleic anhydride, as determined by potentiometric titration). The obtained amount was 93 g. Further, the weight average molecular weight measured by GPC was 7,500 as calculated as polystyrene.

PREPARATION EXAMPLE 8

Into a 1 l four necked flask, 100 g of the styrene/maleic anhydride copolymer obtained in Preparation Example 4 and 300 g of n-propyl alcohol, 300 of dioxane and 15.0 of concentrated hydrochloric acid were charged and reacted under reflux for 12 hours. The reaction solution was dropwise added to pure water to let the polymer precipitate. Then, the precipitate was vacuum-dried to obtain a powder of a n-propyl ester of a styrene/maleic anhydride copolymer (esterification rate: 150% to maleic anhydride, as determined by potentiometric titration). The obtained amount was 102 g. Further, the weight average molecular weight measured by GPC was 7,000 as calculated as polystyrene.

PREPARATION EXAMPLE 9

Into a 1 l four necked flask, 100 g of the styrene/maleic anhydride copolymer obtained in Preparation Example 4, 35 g of aniline and 500 g of dioxane were charged and stirred at room temperature for 12 hours. The reaction solution was dropwise added to a 1% hydrochloric acid aqueous solution to let the polymer precipitate. Then, the precipitate was vacuum-dried to obtain a powder of a phenylamide-modified product of a styrene/maleic anhydride copolymer (amide-modification rate: 100% to maleic anhydride, as determined by potentiometric titration). The obtained amount was 108 g. The weight average molecular weight measured by GPC was 7,000 as calculated as polystyrene.

PREPARATION EXAMPLE 10

Into a 300 ml four necked flask, 75 g of m-cresol, 55 g of p-cresol, 1.75 g of oxalic acid dihydrate and 86 g of 35% formalin aqueous solution were charged. The flask was immersed in an oil bath while stirring the mixture under a nitrogen atmosphere, and the oil bath was heated to 120° C. Then, the stirring was continued for further 5 hours. After the reaction, dissolution and precipitation were repeated, followed by drying to obtain 120 of a novolak resin powder. The average molecular weight as a result of the GPC measurement, was 4,200 as calculated as polystyrene. Further, the dispersion degree (weight average molecular weight/number average molecular weight) was 5.0.

PREPARATION EXAMPLE 11

Into a 1 l autoclave, 50 g of the resin obtained in Preparation Example 10 and 500 g of ethanol were charged and dissolved, and then 7 g of Raney nickel was added thereto. The interior of the autoclave was flashed with nitrogen, and then hydrogen under a pressure of 50 kg/cm$^2$ was purged for 30 minutes at room temperature. After purging, the mixture was stirred at 150° C. for 5 hours to complete the reaction. After cooling, Raney nickel was separated from the reaction solution by filtration, and the filtrate was dropwise added into water to let the resin precipitate. Purification with an ethanol/water system was repeated, followed by vacuum-drying to obtain 47 g of a hydrogenated product of a novolak resin as a white resin powder.

PREPARATION EXAMPLE 12

Into a 300 ml four necked flask, 20 g of the novolak resin obtained in Preparation Example 10, 160 g of 1,4-dioxane and 1.9 g of triethylamine were charged, and then a solution of 2.0 g of methane sulfonyl chloride and 20 g of 1,4-dioxane was dropwise added over a period of 30 minutes at 10° C. under stirring. After completion of the dropwise addition, the stirring was continued of further 3 hours. Then, the reaction solution was dropwise added to 3 l of pure water to let a resin precipitate. The precipitate was collected by filtration, washed and then vacuum-dried to obtain 20.5 g of a methane sulfonyl-modified novolak resin (sulfonylation rate: 10 mol % as calculated from the elemental analytical values) as a white resin powder.

EXAMPLE 1

25 g of the styrene/maleic anhydride copolymer obtained in Preparation Example 4, 6.5 g of 1,2-naphthoquinone diazide sulfonic acid aster (triester) of 2,3,4-trihydroxybenzophenone, 4.5 g of hexamethoxymethylolmelamine (CYMEL (trade mark) 303, manufactured by Mitsui Cyanamid) and 75 g of diethylene glycol dimehyl ether were mixed and dissolved and then subjected to filtration by a 0.2 $\mu$m filter to obtain a resist solution.

Then, the resist solution was spin-coated on a silicon substrate to form a resist layer having a thickness of 2.0 $\mu$m, followed by prebaking at 90° C. for 90 seconds on a hot plate. Then, the resist layer was subjected to exposure with a g-line reduced projection exposure apparatus (DSW 6300A, GCA) and then developed with a 1% tetramethyl ammonium hydroxide aqueous solution. The patterning was able to resolve 1 $\mu$mL/S with 200 mJ/cm$^2$.

Then, the obtained 2 $\mu$mL/S pattern was subjected to entire surface exposure (LI=30) with UV rays (PLA-501), followed by heating on a hot plate of from 130° C. to 160° C. for 5 minutes. It was possible to prepare lens patterns having various curvatures depending upon the respective temperatures. Further, even when subjected to heat treatment at 200° C. after formation of the lens patterns, no deformation of patterns was observed.

The refractive index of the lens patterns was 1.58, which is a satisfactory value for a lens material.

Further, the transparency of the lens patterns in the visible light range was excellent and, for example, was 98.0% (1 $\mu$m thickness) with 400 nm. Even after heat treatment at 200° C. for one hour, no change was observed in the transparency. With respect to the solvent resistance, no surface roughening was observed when the product was immersed in a solvent such as water, isopropyl alcohol, trichloroethane or xylene.

EXAMPLE 2

25 g of a partial ester of styrene/maleic anhydride copolymer (compolymerization ratio: 2/1, weight average molecular weight: 5,000 as measured by GPC and calculated as polystyrene, manufactured by Atochem Incorporated, SMA (trademark)-2625), 6.2 g of a 1,2-naphthoquinone diazide sulfonic acid ester (triester) of 2,3,4-trihydroxybenzophenone, 4.4 g of hexamethoxymethylolmelamine (CYMEL (trade mark) 303, manufactured by Mitsui Cyanamid) and 75 g diethylene glycol dimethyl ether were mixed and dissolved and subjected to filtration by a 0.2 $\mu$m filter to obtain a resist solution.

Then, patterning and lens-forming were conducted in accordance with Example 1. Development was conducted with a 1.5% tetramethyl ammonium hydroxide aqueous solution, whereby it was possible to resolve 1 $\mu$mL/S with a sensitivity of 150 mJ/cm$^2$. With respect to the lens-forming ability, it was possible to prepare lens patterns having various curvatures depending upon the respective temperatures, as in Example 1. No deformation of patterns was observed even when they were subjected to heat treatment at 200° C. after formation of the lens patterns.

The refractive index of the lens patterns was 1.58, which is a satisfactory value of a lens material.

Further, the transparency of the lens patterns in a visible light range was excellent and was, for example, 98.5% (1 μm thickness) with 400 nm. No change in the transparency was observed even after the heat treatment at 200° C. for one hour. With respect to the solvent resistance, no surface roughening was observed when the product was immersed in a solvent such as water, isopropyl alcohol, trichloroethane or xylene.

EXAMPLE 3

25 g of a partial ester of a styrene/maleic anhydride copolymer (compolymerization ratio: 1/1, weight average molecular weight: 5,000 as measured by GPC and calculated as polystyrene, manufactured by Atochem Incorporated, SMA (trade mark)-17352), 5.9 g of a 1,2-naphthoquinone diazide sulfonic acid ester (an average of 3.5/4 ester) of 2,3,4,4'-tetrahydroxybenzophenone, 4.4 g of hexamethoxymehylolmelamine (CYMEL (trade mark) 303, manufactured by Mitsui Cyanamid) and 83 g ethyl lactate were mixed and dissolved and then subjected to filtration by a 0.2 μm filter to obtain a resist solution.

Then, patterning and lens-forming were conducted in accordance with Example 1. Development was conducted with a 1.0% tetramethyl ammonium hydroxide aqueous solution, whereby it was possible to resolve 1 μmL/S with a sensitivity of 240 mJ/cm$^2$. With respect to the lens-forming ability, it was possible to prepare lens patterns having various curvatures depending upon the respective temperatures, as in Example 1. No deformation of patterns was observed even when they were subjected to heat treatment at 200° C. after formation of the lens patterns.

The refractive index of the lens patterns was 1.58, which is a satisfactory value of a lens material.

Further, the transparency of the lens patterns in a visible light range was excellent and for example, was 97.0% (1 μm thickness) with 400 nm. No change in the transparency was observed even after the heat treatment at 200° C. for one hour. With respect to the solvent resistance, no surface roughening was observed when the product was immersed in a solvent such as water, isopropyl alcohol, trichloroethane or xylene.

EXAMPLE 4

25 g of a hydrogenation product of a p-vinylphenol polymer (Resin M (trade mark) PHC-82, manufactured by Maruzen Oil Co., Ltd.), 6.5 g of a 1,2-naphthoquinone diazide sulfonic acid ester (triester) of 2,3,4-trihydroxybenzophenone, 4.5 g of hexamethoxymethylol melamine (CYMEL (trade mark) 303, manufactured by Mitsui Cyaminamid) and 75 g of diethylene glycol dimethylether were mixed and dissolved, and then subjected to filtration by a 0.2 μm filter to obtain a resist solution.

Then patterning and lens-forming were conducted in accordance with Example 1. Development was conducted with a 1.8% tetramethyl ammonium hydroxide aqueous solution, whereby it was possible to resolve 1 μmL/S with a sensitivity of 250 mJ/cm$^2$. With respect to the lens-forming ability, it was possible to prepare lens patterns having various curvatures depending upon the respective temperatures as in Example 1. No deformation of patterns was observed even when subjected to heat treatment at 200° C. after formation of the lens patterns.

The refractive index of the lens patterns was 1.58, which is a satisfactory value for a lens material.

Further, the transparency of the lens patterns in a visible light range was excellent and for example, was 95.0% (1 μm thickness) with 400 nm. No change in the transparency was observed even after the heat treatment at 200° C. for one hour. With respect to the solvent resistance, no surface roughening was observed when the product was immersed in a solvent such as water, isopropyl alcohol, thrichloroethane or xylene.

EXAMPLES 5 to 11

Patterning and lens-forming were conducted in accordance with Example 2 except that the photosensitive agent was changed (see Table 1). The results are shown in Table 1.

EXAMPLES 12 to 20

Patterning and lens-forming were conducted in accordance with Example 1 except that the resin was changed to those prepared by Preparation Examples 1 to 3, 6 to 9, 11 and 12. The results are shown in Table 2.

EXAMPLES 21 to 29

Patterning and lens-forming were conducted in accordance with Example 1 except that the thermosetting agent and the resin were changed (see Table 3). The results are shown in Table 3.

COMPARATIVE EXAMPLE 1

Example 2 was repeated without adding the thermosetting agent (hexamethoxymethylol melamine).

The patterning and lens-forming were good, but when heat treatment was conducted at 160° C. after formation of the lens patterns, flow of the patterns was observed, and the lens shape could not be maintained. Further, also with respect to the solvent resistance, surface roughening, swelling and a change in the layer thickness were observed when the sample was immersed in a solvent such as isopropyl alcohol, trichloroethane or xylene.

COMPARATIVE EXAMPLES 2 and 3

Patterning and lens-forming were conducted in accordance with Example 1 except that the resin was changed to the novolak resin obtained in Preparation Example 10 and polyvinylphenol (Resin M (trade mark), manufactured by Maruzen Sekiyu Kagaku K.K., weight average molecular weight: 5,000). The results are shown in Table 4.

The patterning and the lens-forming ability were good, but the transparency after treating at 200° C. by an accelerated test, was very poor, and such is not useful as a lens material.

The positive photosensitive composition of the present invention comprising an alkali-soluble resin, a photosensitive agent composed of a 1,2-naphthoquinone diazide sulfonate and a thermosetting agent, is a positive resist having high sensitivity and high resolution and is capable of forming lenses by heat treatment after formation of a pattern. The lenses thereby formed have a high refractive index and have excellent properties such as transparency in a visible light range, light resistance, heat resistance and solvent resistance. Therefore, it is suitable for use as a material for micro focusing lenses to be formed on a color filter for a color charge coupled device or a color liquid display.

TABLE 1

Positive photosensitive compositions for forming lenses-Influence of various photosensitive agents
Resin: Partial ester of styrene/maleic anhydride copolymer (SMA (trademark)-2625, manufactured by Atchem Inc.)
Thermosetting agent: Hexamethoxy methylol melamine (CYMEL (trademark)-303, manufactured by Mitsui Cyanamid)
Solvent: Diethylene glycol dimethyl ether

| Example | Photosensitive agent | Developer TMAH aqueous solution*1 (%) | Sensitivity (mJ/cm$^2$) | Resolution (μm) | Lens-forming ability | Heat resistance 200° C. Pattern deformation | Transparency (%) (400 nm) Initial | After treatment at 200° C. |
|---|---|---|---|---|---|---|---|---|
| 5 | 2,4-dihydroxybenzophenone 1,2-naphthoquinone diazide-5-sulfonate (diester) | 3.50 | 200 | 1.0 | ○ | Nil | 98.5 | 95.5 |
| 6 | 2,2',3,4,4'-pentahydroxy-benzophenone 1,2-naphthoquinone diazide-5-sulfonate (4,5 esters*2) | 2.80 | 170 | 1.0 | ○ | Nil | 98.5 | 96.0 |
| 7 | 1,3,5-trihydroxybenzene 1,2-naphthoquinone diazide-5-sulfonate (triester) | 2.50 | 210 | 1.0 | ○ | Nil | 98.5 | 96.0 |
| 8 | Methyl gallate 1,2-naphthoquinone diazide-5-sulfonate (diester) | 0.80 | 190 | 1.0 | ○ | Nil | 98.0 | 95.0 |
| 9 | Methyl gallate 1,2-naphthoquinone diazide-5-sulfonate (triester) | 2.40 | 160 | 1.0 | ○ | Nil | 97.5 | 96.0 |
| 10 | Ethyl gallate 1,2-naphthoquinone diazide-5-sulfonate (triester) | 2.40 | 180 | 1.0 | ○ | Nil | 97.0 | 95.0 |
| 11 | n-Propyl gallate 1,2-naphthoquinone diazide-5-sulfonate (triester) | 2.50 | 200 | 1.0 | ○ | Nil | 97.0 | 95.0 |

*1 an aqueous tetramethyl ammonium hydroxide solution
*2 An equinolar mixture of tetraester and pentaester

TABLE 2

Positive photosensitive compositions for forming lenses-Influence of various resins
Photosensitive agent: 2,3,4-trihydroxybenzophenone 1,2-naphthoquinone diazide-5-sulfoxide (triester)
Thermosetting agent: Hexamethoxymethylol melamine (CYMEL (trademark)-303, manufactured by Mitusi Cyanimid)
Solvent: Diethylene glycol dimethyl ether

| Example | Resin | Developer TMAH aqueous solution*1 (%) | Sensitivity (mJ/cm$^2$) | Resolution (μm) | Lens-forming ability | Heat resistance 200° C. Pattern deformation | Transparency (%) (400 nm) Initial | After treatment at 200° C. |
|---|---|---|---|---|---|---|---|---|
| 12 | Preparation Example 1 | 0.25 | 250 | 1.0 | ○ | Nil | 98.5 | 96.5 |
| 13 | Preparation Example 2 | 2.50 | 180 | 1.0 | ○ | Nil | 98.0 | 96.0 |
| 14 | Preparation Example 3 | 1.00 | 320 | 1.0 | ○ | Nil | 98.5 | 96.5 |
| 15 | Preparation Example 6 | 0.40 | 200 | 1.0 | ○ | Nil | 98.0 | 96.5 |
| 16 | Preparation Example 7 | 0.45 | 250 | 1.0 | ○ | Nil | 98.5 | 96.5 |
| 17 | Preparation Example 8 | 0.25 | 300 | 1.0 | ○ | Nil | 98.5 | 96.5 |
| 18 | Preparation Example 9 | 5.50 | 300 | 1.0 | ○ | Nil | 96.5 | 91.5 |
| 19 | Preparation Example 11 | 2.00 | 350 | 1.0 | ○ | Nil | 97.0 | 92.0 |
| 20 | Preparation Example 12 | 2.40 | 260 | 1.0 | ○ | Nil | 97.0 | 93.0 |

*1 An aqueous tetramethylammonium hydroxide solution

TABLE 3

Positive photosenstive compositions for forming lenses-Influence of various thermosetting agents
Thermosetting agent: Melamine modified product (CYMEL (trademark), manufactured by Mitsui Cyanamid)
Photosensitive agent: 2,3,4-trihydroxybenzophenone 1,2-naphthoquinone diazide-5-sulfonate (triester)
Solvent: Diethylene glycol dimethyl ether

| Example | Thermosetting agent | Resin | Developer TMAH aqueous solution*1 (%) | Sensitivity (mJ/cm$^2$) | Resolution (μm) | Lens-forming ability | Heat resistance 200° C. Pattern deformation | Transparency (%) (400 nm) Initial | After treatment at 200° C. |
|---|---|---|---|---|---|---|---|---|---|
| 21 | CYMEL (trademark) 350 | Preparation Example 6 | 0.25 | 190 | 1.0 | ○ | Nil | 98.5 | 97.0 |
| 22 | CYMEL (trademark) 235 | Preparation Example 6 | 0.65 | 180 | 1.0 | ○ | Nil | 98.0 | 96.5 |
| 23 | CYMEL (trademark) 238 | Preparation Example 6 | 0.80 | 180 | 1.0 | ○ | Nil | 98.0 | 96.5 |
| 24 | CYMEL (trademark) 1156 | Preparation Example 6 | 1.50 | 160 | 1.0 | ○ | Nil | 97.5 | 96.0 |
| 25 | CYMEL (trademark) 1158 | Preparation Example 6 | 2.50 | 220 | 1.0 | ○ | Nil | 98.5 | 97.0 |
| 26 | CYMEL (trademark) 1123 | Preparation | 0.30 | 260 | 1.0 | ○ | Nil | 98.5 | 97.0 |

TABLE 3-continued

Positive photosenstive compositions for forming lenses-Influence of various thermosetting agents
Thermosetting agent: Melamine modified product (CYMEL (trademark), manufactured by Mitsui Cyanamid)
Photosensitive agent: 2,3,4-trihydroxybenzophenone 1,2-naphthoquinone diazide-5-sulfonate (triester)
Solvent: Diethylene glycol dimethyl ether

| | | | Developer TMAH aqueous solution*[1] (%) | Sensitivity (mJ/cm$^2$) | Resolution (μm) | Lens-forming ability | Heat resistance 200° C. Pattern deformation | Transparency (%) (400 nm) | |
|---|---|---|---|---|---|---|---|---|---|
| Example | Thermosetting agent | Resin | | | | | | Initial | After treatment at 200° C. |
| 27 | CYMEL (trademark) 1156 | Example 8 Preparation | 0.50 | 320 | 1.0 | ○ | Nil | 98.5 | 97.5 |
| 28 | CYMEL (trademark) 1158 | Example 8 Preparation | 0.60 | 280 | 1.0 | ○ | Nil | 98.5 | 96.5 |
| 29 | CYMEL (trademark) 350 | Example 1 Preparation Example 12 | 1.850 | 230 | 1.0 | ○ | Nil | 97.5 | 92.0 |

*[1] An aqueous tetramethylammonium hydroxide solution

TABLE 4

Positive photosensitive compositions for forming lenses-Influence of various resins
Photosensitive agent: 2,3,4-trihydroxybenzophenone 1,2-naphthoquinone diazide-5-sulfoxide (triester)
Thermosetting agent: Hexamethoxymethylol melamine (CYMEL (trademark)-303, manufactured by Mitsui Cyanimid)
Solvent: Diethylene glycol dimethyl ether

| Comparative Example | Resin | Developer TMAH aqueous solution*[1] (%) | Sensitivity (mJ/cm$^2$) | Resolution (μm) | Lens-forming ability | Heat resistance 200° C. Pattern deformation | Transparency (%) (400 nm) | |
|---|---|---|---|---|---|---|---|---|
| | | | | | | | Initial | After treatment at 200° C. |
| 2 | Novolak resin | 2.20 | 220 | 0.7 | ○ | Nil | 95.0 | 25.0 |
| 3 | Polyvinylphenol | 0.80 | 180 | 1.0 | ○ | Nil | 95.5 | 45.0 |

*[1] An aqueous tetramethylammonium hydroxide solution

We claim:

1. A positive photosensitive composition for forming lenses, which comprises in admixture a polymer in an amount effective to maintain transparency when said lenses are heated again after being molded, a photosensitive agent in a photosensitizing effective amount, a thermosetting agent in an amount effective to impart heat resistance and solvent resistance to said lenses, and an amount of a solvent sufficient to at least dissolve the polymer, photosensitive agent and thermosetting agent, wherein said polymer is an alkali-soluble resin having an aromatic ring component and a carboxylic acid component partially modified by esterification or amidification, a vinyl phenol polymer or a hydrogenated vinyl phenol polymer having hydroxyl groups modified by alkylation, acylation or sulfonylation, or a novolak polymer or a hydrogenated novolak polymer having hydroxyl groups modified by alkylation, acylation or sulfonylation, said photosensitive agent is a 1,2-naphthoquinone diazide sulfonate and said thermosetting agent is a thermosetting agent capable of imparting heat resistance and solvent resistance at the time of forming lenses by heat treatment.

2. The positive photosensitive composition for forming lenses according to claim 1, wherein the alkali-soluble resin comprises structural units of the following formula (1):

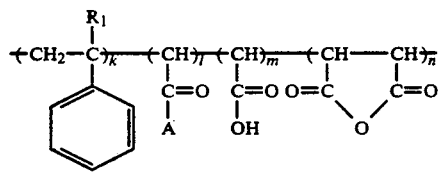

wherein R$_1$ is hydrogen or a methyl group, A is OA$_1$ or NA$_2$A$_3$ wherein each of A$_1$, A$_2$ and A$_3$ is hydrogen, a C$_1$-C$_6$ alkyl group, a C$_6$-C$_{12}$ aryl group or a C$_7$-C$_{12}$ aralkyl group, each of k and m is an integer of at least 1, and each of l and n is an integer inclusive of 0, said alkali-soluble resin being partially esterified or amidified.

3. The positive photosensitive composition for forming lenses according to claim 1, wherein the alkali-soluble resin comprises structural units of the following formula (2):

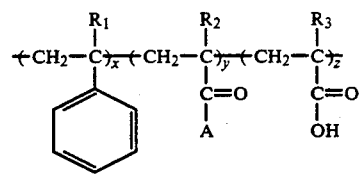

wherein R$_1$ is hydrogen or a methyl group, each of R$_2$ and R$_3$ is hydrogen, a methyl group, chlorine or bromine, A is OA$_1$ or NA$_2$A$_3$ wherein each of A$_1$, A$_2$ and A$_3$ is hydrogen, a C$_1$-C$_6$ alkyl group, a C$_6$-C$_{12}$ aryl group or a C$_7$-C$_{12}$ aralkyl group, each of x and y is an integer inclusive of 0, and z is an integer of at least 1, said alkali-soluble resin being partially esterified or amidified.

4. The positive photosensitive composition for forming lenses according to any one of claims 1, 2 or 3, wherein the 1,2-naphthoquinone diazide sulfonate comprises one type or more types of the structural units of the formulas (3) to (5):

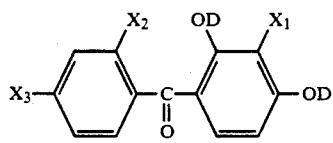 (3)

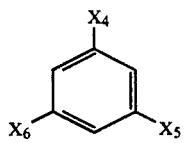 (4)

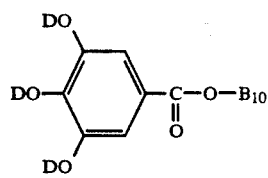 (5)

wherein each of $X_1$, $X_2$ and $X_3$ is hydrogen or OD, each of $X_4$, $X_5$ and $X_6$ is hydrogen, a $C_1$–$C_6$ alkyl group or OD, B is a $C_1$–$C_6$ alkyl group, a $C_6$–$C_{12}$ aryl group, or $C_7$–$C_{12}$ aralkyl group, and D is hydrogen, a 1,2-naphthoquinone diazide-4-sulfonyl group or a 1,2-naphthoquinone diazide-5-sulfonyl group, provided at least one is a 1,2-naphthoquinone diazide-4-sulfonyl group or a 1,2-naphthoquinone diazide-5-sulfonyl group.

5. The positive photosensitive composition for forming lenses according to any one of claims 1, 2 or 3, wherein the thermosetting agent comprises structural units of the formula (6):

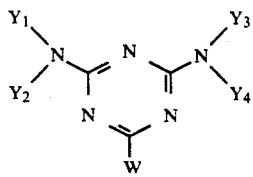 (6)

wherein W is —$NY_5Y_6$ or a phenyl group, each of $Y_1$ to $Y_6$ is hydrogen or —$CH_2OZ$ wherein Z is hydrogen or a $C_1$–$C_6$ alkyl group.

6. The positive photosensitive composition for forming lenses according to any one of claims 1, 2 or 3, wherein the components comprising the polymer, the photosensitive agent and the thermosetting agent are in an amount ranging from 10 to 40% by weight in the sum total based on the composition and the solvent is in a balancing amount, said polymer being in an amount ranging from 54 to 86%, said photosensitive agent being in an amount ranging from 7 to 22% and said thermosetting agent being in an amount ranging from 5 to 30%, respectively by weight based on the components.

7. The positive photosensitive composition for forming lenses according to claim 1, wherein the alkali-soluble resin is a vinyl phenol polymer or a hydrogenated vinyl phenol polymer having hydroxyl groups modified by alkylation, acylation or sulfonylation, or a novolak polymer or a hydrogenated novolak polymer having hydroxyl groups modified by alkylation, acylation or sulfonylation.

8. A process for producing the composition as set forth in any one of claims 2 or 3, which comprises providing said polymer, said photosensitive agent, said thermosetting agent and said solvent, and dissolving the first 3 members into said solvent.

* * * * *